United States Patent
Chopra et al.

(10) Patent No.: US 9,439,293 B2
(45) Date of Patent: Sep. 6, 2016

(54) GALVANIC PROCESS FOR MAKING PRINTED CONDUCTIVE METAL MARKINGS FOR CHIPLESS RFID APPLICATIONS

(75) Inventors: Naveen Chopra, Oakville (CA); Peter M. Kazmaier, Mississauga (CA); Dominique J. Lalisse, Palmyra, NY (US); Paul F. Smith, Oakville (CA)

(73) Assignee: XEROX CORPORATION, Norwalk, CT (US)

( * ) Notice: Subject to any disclaimer, the term of this patent is extended or adjusted under 35 U.S.C. 154(b) by 1068 days.

(21) Appl. No.: 11/943,774

(22) Filed: Nov. 21, 2007

(65) Prior Publication Data

US 2009/0130299 A1    May 21, 2009

(51) Int. Cl.
*B05D 5/12* (2006.01)
*H05K 3/18* (2006.01)
*H05K 3/12* (2006.01)

(52) U.S. Cl.
CPC ............... *H05K 3/182* (2013.01); *H05K 3/12* (2013.01); *H05K 3/125* (2013.01); *H05K 2203/013* (2013.01); *H05K 2203/1157* (2013.01)

(58) Field of Classification Search
USPC ........................................................ 427/98.4
See application file for complete search history.

(56) References Cited

U.S. PATENT DOCUMENTS

| | | | |
|---|---|---|---|
| 3,084,063 A | | 4/1963 | Barnes et al. |
| 3,956,528 A | * | 5/1976 | Ugro, Jr. ................... 205/85 |
| 4,581,256 A | * | 4/1986 | Sommer ..................... 427/305 |
| 6,065,424 A | * | 5/2000 | Shacham-Diamand et al. ........................ 118/696 |
| 7,626,125 B2 | * | 12/2009 | Nakamura ................ 174/257 |
| 2003/0148024 A1 | * | 8/2003 | Kodas et al. ............. 427/125 |
| 2003/0157272 A1 | * | 8/2003 | Tonai ............... H01L 21/76877 427/600 |
| 2004/0112756 A1 | * | 6/2004 | Boyd et al. ............... 205/291 |
| 2005/0006339 A1 | * | 1/2005 | Mardilovich et al. ........ 216/39 |
| 2005/0012615 A1 | * | 1/2005 | Piccoli et al. ............ 340/572.1 |
| 2006/0003152 A1 | * | 1/2006 | Youngs ..................... 428/212 |
| 2006/0165895 A1 | * | 7/2006 | Cartagena ................. 427/258 |
| 2006/0185474 A1 | * | 8/2006 | Yamada et al. .............. 75/255 |
| 2007/0051694 A1 | * | 3/2007 | Asai et al. .................. 216/13 |
| 2007/0259293 A1 | * | 11/2007 | Shin et al. ................. 430/324 |

FOREIGN PATENT DOCUMENTS

| | | |
|---|---|---|
| CN | 1 745 194 A | 3/2006 |
| CN | 1 849 411 A | 10/2006 |
| WO | WO 2006/014861 A2 | 2/2006 |

OTHER PUBLICATIONS

Bidoki et al. "Ink-jet fabrication of electronic components" (2007).*
Bidoki et al. "Ink-jet fabrication of electronic components" (Apr. 2007).*
Office Action issued Jan. 18, 2012 in Chinese Patent Application No. 200810173379.0.
Office Action issued Aug. 22, 2012 in Chinese Patent Application No. 200810173379.0.
Office Action issued Mar. 14, 2013 in Chinese Patent Application No. 200810173379.0.
Office Action dated Sep. 27, 2013 issued in Chinese Patent Application No. 200810173379.0 (with translation).

* cited by examiner

*Primary Examiner* — Austin Murata
(74) *Attorney, Agent, or Firm* — MH2 Technology Law Group LLP

(57) ABSTRACT

A process for printing a metal wire pattern on a substrate, including: printing a first salt solution including a metal ion that will undergo a reduction half-reaction; printing a second salt solution containing a reductant that will undergo an oxidation half-reaction in contact with the first salt solution, resulting in the reduction of the metal ions of the first salt solution; and allowing the first and second salt solutions to react by a galvanic reaction, causing reduced metal ions of the first salt solution to precipitate as a solid, on the substrate.

20 Claims, No Drawings

US 9,439,293 B2

GALVANIC PROCESS FOR MAKING PRINTED CONDUCTIVE METAL MARKINGS FOR CHIPLESS RFID APPLICATIONS

TECHNICAL FIELD OF THIS INVENTION

The present disclosure relates to a process for printing wire patterns on substrates for use as resonant antennae in chipless RFD applications, using a printing process whereby two salt solutions are printed on top of one another in the desired pattern, causing a spontaneous galvanic reaction and leading to precipitation and deposition of the reduced metal particles at the interface of the two salt solutions.

BACKGROUND

Recently, radio frequency identification (REID) technology has gained tremendous popularity as a device for storing and transmitting information. RFID technology utilizes a tag transponder, which is placed on an object, and a reader, also referred to herein as an interrogator, to read and identify the tag. RFID technologies are broadly categorized as using either "active" tags or "passive" tags. Active tags have a local power source (such as a battery) so that the active tag sends a signal to be read by the interrogator. Active tags have a longer signal range. "Passive" tags, in contrast, have no internal power source. Instead, passive tags derive power from the reader, and the passive tag re-transmits or transponds information upon receiving the signal from the reader. Passive tags have a much shorter signal range (typically less than 20 feet).

Generally, both categories of tags have an electronic circuit that is typically in the form of an integrated circuit or silicon chip. The circuit stores and communicates identification data to the reader. In addition to the chip, the tag includes some form of antenna that is electrically connected to the chip. Active tags incorporate an antenna which communicates with the reader from the tag's own power source. For passive tags, the antenna acts as a transducer to convert radio frequency (RF) energy originating from the reader to electrical power. The chip then becomes energized and performs the communication function with the reader.

On the other hand, a chip less RFID tag has neither an integrated circuit nor discrete electronic components, such as the transistor. This feature allows chipless RFID tags to be printed directly onto a substrate at lower costs than traditional RFID tags.

As a practical matter, RFID technology uses radio frequencies that have much better penetration characteristics to material than do optical signals, and will work under more hostile environmental conditions than bar code labels. Therefore, the RFID tags may be read through paint, water, dirt, dust, human bodies, concrete, or through the tagged item itself. RFID tags may be used in managing inventory, automatic identification of cars on toll roads, security systems, electronic access cards, keyless entry and the like.

The RFID antenna may be printed directly on the substrate using a conductive metal ink. Alternatively, metal fibers may be incorporated directly into the substrate. For example, one chipless RFID technology from Inckode Corp uses embedded aluminum fibers that are embedded into paper. The aluminum fibers must be cut to the appropriate wavelength (¼ wavelength) and be incorporated into the paper fibers as a furnish additive during the papermaking process. Therefore, the Inkode method is costly and tedious.

Although particulate metal materials may be used for printing RFID inks, the superior characteristics of nanoparticulate metal materials in ink applications yields a better product. Commonly used nanomaterials are gold, silver, nickel and copper, among others. Nickel has been used for conductive inks for a ver, limited extent because of its relatively low conductivity (about 4 times less than that of copper or silver). Gold and silver can provide good conductivity, but are relatively expensive. Copper provides good conductivity at a low price (about one percent of that of silver). Unfortunately, copper is easily oxidized and the oxide is non-conductive.

It is known that copper can be deposited by the Galvanic action of a metal higher than copper in the galvanic series on a solution of a copper salt. The Galvanic process uses a spontaneous chemical reaction between two reagents to generate electricity. The process involves electron flow from the anodic reagent to the cathodic reagent, resulting in the reduction of the electron acceptor reagent and the oxidation of the electron donor reagent. In general, copper will precipitate from a solution of a copper salt by the Galvanic action of any metal having a lower reduction potential than copper (typically described as a less noble metal). For example, zinc metal (standard reduction potential of −0.76V) and aluminum metal (standard reduction potential of −1.68V) have lower reduction potentials than copper metal (standard reduction potential of +0.34V). Hence, both zinc and aluminum metals are capable of precipitating copper metal from a copper ion salt solution.

U.S. Pat. No. 3,084,063 to Barnes et al describes in a method of using the galvanic process to deposit copper on a substrate, but Barnes' method involves injecting a Fluid suspension of a precipitating metal in powder form into a confined turbulent stream of a solution of a cupric salt flowing under pressure, and then spraying the mixture toward a surface to be coppered in such a manner that droplets of the mixture arrive at the surface before there has been sufficient interaction within the mixture to precipitate appreciable amounts of metallic copper. As Barnes describes, under normal circumstances, deposition of copper commences approximately 20 seconds after mixing of the precipitating metal with the cupric salt solution. Therefore, the mixture must be sprayed before this period has lapsed. Additionally, Barnes does not mention use of nanoparticle metals.

Thus, there exists a need for a cheaper method for producing chipless RFID tags.

SUMMARY

The present disclosure provides a method of printing wire patterns on substrates for use as resonant antennae in chipless RFID applications, using a printing process of two salt solutions, wherein one solution contains a metal ion. The two solutions are printed on top of one another in the desired pattern, causing a spontaneous galvanic reaction and leading to precipitation and deposition of the reduced metal nanoparticles at the interface of the two salt solutions.

The present disclosure relates to a method for printing metal wire patterns on substrates by the galvanic process, comprising: printing a first salt solution containing a metal ion that will undergo a reduction half-reaction; printing a second salt solution containing an ion that will undergo an oxidation half-reaction on top of the first solution; and allowing said first and second salt solutions to react, resulting in the reduction of the metal ions of the first salt solution, and causing the reduced metal ions of said first solution to precipitate as a solid, wherein said solid precipitates are deposited on the substrate, forming metal wires on the substrate via a spontaneous galvanic reaction.

The present disclosure also relates to a system comprising: a first salt solution containing a metal ion that will undergo a reduction half-reaction; a second salt solution containing an ion that will undergo an oxidized half-reaction; a substrate on which the two salt solutions are printed, whereby the two salt solutions are printed on top of one another, allowed to react, causing the reduced metal ions of the first solution to precipitate as a solid, wherein the solid precipitates are deposited on the substrate, forming metal wires on the substrate via a spontaneous galvanic reaction.

The advantages of the present disclosure are numerous. Because the present disclosure employs a homogenous solution of metallic precursors, It avoids the issues associated with printing of particulate matter, such as the presence of solid particles in the solution to settle in the ink, or to clog the printheads. Additionally, annealing the conductive ink to the substrate is not required. This is particularly advantageous because additional energy is not required in order to anneal metal particles together and create the conductive feature. Consequently, a wide variety of substrates can be suitable for use, since the formation of conductive features on delicate and/or temperature-sensitive substrates (such as, for example, plastic films) is possible. Additionally, the present disclosure may provide a lower cost or higher yield than printing with conductive ink.

EMBODIMENTS

In general, the disclosure provides a method and system for printing metal wire patterns on a substrate, in which metal wire patterns can be used in various applications, including electrical applications, such as, for example, as resonant antennae in chipless RFID applications. In addition, it is clear that the printed metallic patterns can be used for decoration purposes, even if the resulting pattern is not electrically conductive. The metal wire patterns are generally formed by a galvanic process, where multiple salt solutions interact to form deposited metal wires. In an embodiment, the method generally comprises printing a first salt solution containing a metal ion that will undergo a reduction half-reaction, and printing a second salt solution containing an ion that will undergo an oxidized half-reaction on top of the first solution. The first and second salt solutions are then allowed to react, causing the reduced metal ions of the first salt solution to be deposited on the substrate as a nanoparticle solid, whereby the metal nanoparticle solid forms metal wires on the substrate via a spontaneous galvanic reaction. The process is now described in detail.

This disclosure is not limited to particular embodiments described herein, and some components and processes may be varied by one of ordinary skill in the art, based on this disclosure. The terminology used herein is for the purpose of describing particular embodiments only, and is not intended to be limiting.

In this specification and the claims that follow, singular forms such as "a," "an," and "the" include plural forms unless the content clearly dictates otherwise.

The First and Second Salt Solutions

The first step involves printing the first salt solution onto the substrate. Any suitable material may be used for the first salt solution. The first salt solution generally can include a metal ion in a suitable carrier material. The metal ion can undergo a reduction reaction when reacted with the second salt solution, to form a metal nanoparticle solid that will be deposited on the substrate.

In one embodiment, the first salt solution can contain ions of copper, aluminum, magnesium, manganese, zinc, chromium, lead, cadmium, cobalt, nickel, gold, silver, platinum, tin, palladium, indium, iron, tungsten, molybdenum, ruthenium, bismuth, other suitable metal ions, or mixtures thereof. These metal ions can be provided, for example, by mixing a suitable metal salt into a solvent or carrier liquid. For example, the metal salt can be provided in the form of metal sulfates, metal halides (such as metal chlorides or metal bromides), metal nitrates, metal acetates, metal nitrites, metal oxides, metal carbonates, metal hydroxides, metal oxalates, metal pyrazolyl borates, metal azides, metal fluoroborates, metal carboxylates, metal halogencarboxylates, metal hydroxycarboxylates, metal aminocarboxylates, metal aromatic and nitro and/or fluoro substituted aromatic carboxylates, metal aromatic and nitro and/or fluoro substituted aromatic carboxylates, metal beta diketonates, metal sulfonates, or the like.

In an exemplary embodiment, the metal ions in the first solution can be provided as copper (II) ions. These ions can be provided, for example, by incorporating such metal salts as copper sulfate, copper chloride, copper nitrate, or copper acetate. Of course, other metals, and other metal salts, can also be used.

In embodiments, the size of the metal nanoparticles is from about 5 nm to about 100 nm. More specifically, the size of the metal nanoparticle is from about 20 nm to about 60 mm. Even more specifically, the size of the metal nanoparticles is from about 5 nm to about 7 nm.

Any suitable solvent or carrier liquid can be used for preparing the first salt solution. The solvent or carrier liquid can be polar or non-polar. Solvents that are useful in the present disclosure include amines, amides, alcohols, water, ketones, unsaturated hydrocarbons, saturated hydrocarbons, mineral acids, organic acids and bases. For example suitable solvents include alcohols, amines, amides, water, ketones, ether, aldehydes and alkenes. N,N,-dimethylacetamide (DMAc), diethyleneglycol butylether (DEGBE), ethanolamine, N-methyl pyyrolidone, ethylene glycol, propylene glycol, diethylene glycol, and the like.

In some cases, the solvent can be a high melting point solvent, such as one heaving a melting point of at least about 30° C. but less than or equal to about 100° C. In this embodiment, a heated ink-jet head can be used to deposit the precursor composition while in a flow able state whereby the solvent solidifies upon contacting the substrate. Subsequent processing can then remove the solvent by other means and then convert the material to the final product, thereby retaining resolution. Preferred solvents according to this embodiment are waxes, high molecular weight fatty acids, alcohols, acetone, N-methyl-2-pyrrolidone, toluene, tetrahydrofuran and the like. Alternatively, the precursor composition may be a liquid at room temperature, wherein the substrate is kept at a lower temperature below the freezing point of the composition.

The solvent can also be a low melting point solvent. A low melting point is required when the precursor composition must remain as a liquid on the substrate until dried. A preferred low melting point solvent according to this embodiment is DMAc, which has a melting point of about −20° C.

In addition, the solvent can be a low vapor pressure solvent. A lower vapor pressure advantageously prolongs the work life of the composition in cases where evaporation in the ink-jet head, syringe or other tool leads to problems such as clogging. A preferred solvent according to this embodiment is terpineol. Other low vapor pressure solvents include diethylene glycol, ethylene glycol, hexylene glycol, N-methyl-2-pyrrolidone, and tri(ethylene glycol) dimethyl ether.

The solvent can also be a high vapor pressure solvent, such as one having a vapor pressure of at least about 1 kPa. A high vapor pressure allows rapid removal of the solvent by drying. High vapor pressure solvents include acetone, tetrahydrofuran, toluene, xylene, ethanol, methanol, 2-butanone and water.

The second step involves printing the second salt solution onto the substrate. For the second salt solution according to the present disclosure, any suitable materials may be used, and generally comprises a reductant in a suitable carrier material. The second salt solution generally can include a reductant that, when reacted with the first salt solution, will undergo an oxidation half-reaction and reduce the metal ions in the first salt solution. The reductant in the second salt solution can be an ionic metal species or any other reductant. If an ionic metal species is used as the reductant in the second salt solution, it is desired in embodiments that no elemental metal is used, so as to avoid using any metal particles at all. For example, using $Al/Al^{3+}+3e-$ as the oxidation half-reaction would require aluminum particles, and is less desirable.

The second salt solution can thus contain any suitable metal ion that undergoes the stated oxidation half-reaction. Suitable metals ions for use in the second solution can be selected from any metal ions that are suitable for use in the first solution, such that the interaction between the first and second salt solutions produces a positive standard reduction potential. The metal ions in the second salt solution can be provided, for example, by mixing a suitable metal salt into a solvent or carrier liquid. For example, the metal salt can be provided in the form of metal sulfates, metal halides (such as metal chlorides or metal bromides), metal nitrates, metal acetates, metal nitrites, metal oxides, metal carbonates, metal hydroxides, metal oxalates, metal pyrazolyl borates, metal azides, metal fluoroborates, metal carboxylates, metal halogencarboxylates, metal hydroxycarboxylates, metal aminocarboxylates, metal aromatic and nitro and/or fluoro substituted aromatic carboxylates, metal aromatic and nitro and/or fluoro substituted aromatic carboxylates, metal beta diketonates, metal sulfonates, or the like.

In an exemplary embodiment, the metal ions in the second salt solution can be provided as iron (II), tin (II), lead (II), or chromium (II) ions. These ions can be provided, for example, by incorporating such metal salts as $Cr(OH)_2$, $Fe(OH)_2$, $Sn(OH)_2$, or $Pb(OH)_2$. Of course, other metals, and other metal salts, can also be used.

Any suitable solvent or carrier liquid can be used for preparing the second salt solution. A suitable solvent or carrier liquid used for preparing the second salt solution may be selected from any solvent or carrier liquid suitable for preparing the first salt solution, although such identity of solvents is not required and different materials can be used, in embodiments.

Other materials that may optionally be added to the first salt solution, the second salt solution, or both salt solutions, include humectants, viscosity and surface tension modifiers (such as thickeners like polymers, or surfactants). A preferred viscosity range for inkjet printing of the salt solutions is 1-100 cP, preferably 1-10 cP.

The two salt solutions are thus chosen such that the redox potential enables a spontaneous galvanic reaction to create the metal wire. In an exemplary embodiment, the first and second salt solutions contain salts of copper (II) and chromium (III), respectively. The standard reduction potentials for the two metals are given below:

$$Cu^{2+}+2e^-\rightarrow Cu \quad E^0=+0.34V \qquad (1)$$

$$Cr^{3+}+1e^-\rightarrow Cr^{2+} \quad E^0=-0.42V \qquad (2)$$

Thus, by reversing the chromium to an oxidation, and balancing the charge, the reaction of the present disclosure is depicted as:

$$Cu^{2+}+2Cr^{2+}\rightarrow Cu+2Cr^{3+} \quad E^0=+0.76V \qquad (3)$$

The positive cell potential indicates a spontaneous process. The Gibbs Free Energy calculates to −146 kJ.

The Printing Process

The order in which the salt solutions are printed is interchangeable. Thus, in embodiments, the first solution (the solution containing metal ions to be reduced) is printed on the substrate, followed by the second solution (the solution containing reductants). Alternatively, the solution containing reductants is printed on the substrate first, followed by the printing of the solution containing metal ions to be reduced. In still other embodiments, it is possible that the first and second solutions can be printed at the same time. For example, the first and second solutions can be printed such that they overlap and interact only upon contact on the substrate surface, or they can overlap and interact either before or after ejection from the printer head prior to deposition on the substrate surface.

Any suitable printing method may be used to print the salt solutions onto a substrate. For example, the method of printing can be inkjet, screen printing, gravure, rotogravure, and flexography, or the like. In a particular embodiment, the method used is inkjet printing. The respective first and second salt solutions can be ejected, for example, through the same or separate ink jet nozzles from separate supply tanks or reservoirs, in the same manner that two- or multi-color printing is conducted with such printers.

Moreover, the two salt solutions may be printed via a two-pass process, whereby the printer head prints one salt solution during the first pass over the substrate, then prints the second salt solution during a subsequent second pass over the substrate. Alternatively, the two salt solutions may be printed during a single pass of the printer head over the substrate. This can be achieved through any means known in the art. For example, each salt solution can be stored in a separate reservoir. The printing system delivers each salt solution to the separately to the substrate, and the two salt solutions interact. Furthermore, the salt solutions may be delivered to the substrate simultaneously or consecutively.

The two salt solutions may be printed in a manner such that: 1) one salt solution fully overlaps the other salt solution, or 2) the two salt solutions partially overlap. Naturally, metal wires will form only at the interface of the two salt solutions, i.e. where there is overlap or intermixing of the two salt solutions. Accordingly, tailoring the degree or width of overlap of the two salt solutions on the substrate may allow for tailoring of width of the resultant printed metal wires. This may allow for printing of metal wires having widths smaller than the resolution of the printer, such as smaller than the width of the inkjet nozzle used to print the solutions.

In embodiments, the size of the individual printed metal wires depend on the antenna type desired. For example, for forming conductive fiber antennas, the fibers can have dimensions ranging from about 4 μm to about 6 μm thick, from about 0.1 mm to about 2 mm wide, and from about 5 mm to about 10 mm long. The length of the fibers depend on the resonant frequency. The equation relating resonator length $\lambda$ and frequency is expressed as $\lambda=c/$frequency, where c is the speed of light. Thus, for example, for a ~25 GHz resonator, the wavelength is 12 mm. In order to function as a backscattering reflective antenna, a fiber having ¼ the wavelength, or 3 mm, is preferred. Likewise, since resonators of one-half wave dimensions at frequencies on the order of about 10 GHz to about 100 GHz are quite small, they may be used for uniquely identifying large numbers of targets. For other types of antennas, such as HF coils and UHF fan-shaped antennas, the fibers are from about 5 µm to about 50 µm in thickness, and from about 0.1 mm to about 1 mm in width. Of course, the length of the fibers will vary as a function of frequency.

In a preferred embodiment, the ink is printed to provide metal wires that have a print thickness of from about 0.01 µm to about 5 µm and a print resistance of from about 10 ohms/square to about 10,000 ohms/square.

Substrates

Any suitable substrate can be used for forming the printed structures. For example, suitable substrates can include, but are not limited to, paper, glass art paper, bond paper, paperboard, Kraft paper, cardboard, semi-synthetic paper or plastic sheets, such as polyester or polyethylene sheets, and the like. These various substrates can be provided in their natural state, such as uncoated paper, or they can be provided in modified forms, such as coated or treated papers or cardboard, printed papers or cardboard, and the like.

Additional Processing Steps

Optionally, additional processing steps, such as any of overcoating, drying and rinsing, alone or in combination, may follow the printing step.

For the optional overcoating step, any suitable overcoating may be applied after the printing process is completed. For example, a suitable overcoating can be applied to cover and protect the printed metal wires, such as to protect them from abrasion, chemical attack, or the like. When so applied, the overcoating can be of any desired thickness, opacity, transparency, or the like.

Additionally, an optional drying step may follow the precipitation and deposition of metal on the substrate. The metal precipitate is allowed to dry for about 5 minutes at 80° C.

Finally, an optional rinsing step may follow the precipitation and deposition of metal on the substrate or the drying step. Such rinsing step eliminates excess reagents. Suitable solutions for use in the rinsing step include, for example, water, acetone, methanol, ethanol, glycol, and hexanes.

In embodiments, the two salt solutions are allowed to react for about 30 minutes, followed by a rinse with water, in order to remove unreacted metal salts, followed by low-boiling water miscible solvents to remove residual water (such as ethanol or acetone), each for 1 minute. If the original metal salts are mixed in solvents, other than water (such as ethylene glycol), then a 1 minute rinsing with ethylene glycol prior to the water wash is required.

Applications of the Present Disclosure

The present disclosure offers many possible applications. The printing process of this disclosure may be used to manufacture electronic and electrical circuit systems, including electrical interconnects and electrical and electronic components. Moreover, the printing process of this disclosure may be used to print electrical components, including resistors, capacitors, inductors, and RFID tags, as well as electric circuits. Additionally, the printing process of this disclosure may be used to print microwave strip line structures directly onto flexible substrates to form microwave integrated circuits (MICs), and microwave antennas. It should be noted that it is feasible to print any type of antenna with this galvanic process, including, for example, HF coils, UHF fan-shaped antennas, and fibers.

An example is set forth herein below and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

Preparation of Salt Solution for Reduction Half-Reaction

In a 10 mL volumetric flask, 25 mg of $CuSO_4.5H_2O$ was dissolved in deionized water and made up into a 10 mL solution, with a final $Cu^{2+}$ salt concentration of 10 mM. Similarly, a 10 mM solution of $CuNO_3$ was also prepared by dissolving 23 mg of $CUNO_3$ in 10 mL deionized water. Both solutions were pale blue in color.

2. Preparation of Salt Solution for Oxidation Half-Reaction

In a 10 mL volumetric flask, 7.8 mg of $[Cr(OAc)_2.H_2O]_2$ was dissolved in deionized water and made up into a 10 mL solution, with a final $Cr^{2+}$ salt concentration of 10 mM. Similarly, a 10 mM solution of $CrCl_2$ was also prepared by dissolving 12.3 mg of $CrCl_2$ in 10 ml, deionized water. Both solutions were deep violet in color.

3. Formation and Deposit of Copper Wires on Substrate Via Galvanic Process

A Dimatix printer cartridge was loaded with a $Cu^{2+}$ salt solution (whose preparation is described above), and lines were printed on glossy coated paper. This cartridge was removed, and a second Dimatix printer cartridge was loaded with a $Cr^{2+}$ salt solution (whose preparation is described above), and inserted into the printer. The initial printer $Cu^{2+}$ lines were overprinted with the $Cr^{2+}$ salt solution. The overprinted lines turned brown/orange in color, indicative of the plating out of pure copper films. The solvent residue was allowed to evaporate off, resulting in dried line features made of copper.

It will be appreciated that various of the above-disclosed and other features and functions, or alternatives thereof may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for printing a conductive metal wire pattern on a substrate, comprising:
   printing a homogenous first salt solution comprising a first solvent and a first metal ion, the first metal ion selected from the group consisting of copper, aluminum, magnesium, manganese, zinc, chromium, lead, cadmium, cobalt, nickel, gold, silver, platinum, tin, iron, and mixtures thereof;

printing a homogeneous second salt solution comprising a second solvent and a second metal ion configured to reduce the homogeneous first salt solution, the second metal ion selected from the group consisting of iron (II), lead (II), chromium (II), mercury (II), platinum (IV), palladium (IV), nickel (III), and cobalt (III); and forming a metal wire pattern by the galvanic reaction on the substrate of the printed homogeneous first and the homogeneous second salt solutions to precipitate the first metal ion as solid metal nanoparticles having a size of about 5 nm to about 7 nm on the substrate;

wherein:
additional energy is not required to anneal the metal nanoparticles together and create the conductive metal wire pattern;

the second metal ion has a lower reduction potential than the first metal ion;

the first and/or second salt solutions are printed directly onto the substrate;

the substrate is selected from the group consisting of paper, glass art paper, bond paper, paperboard, Kraft paper, cardboard, semi-synthetic paper, and plastic sheets;

the printing of the first salt solution and the second salt solution is performed using a heated printer that deposits the first salt solution and the second salt solution onto the substrate in a flowable state; and after mixing and reacting, the first solvent of the first salt solution and the second solvent of the second salt solution evaporate to form the metal wire pattern by depositing the reduced first metal ion nanoparticle on the substrate.

2. The method according to claim 1, wherein the first metal ion in the homogenous first salt solution is copper (II).

3. The method according to claim 1, wherein the second metal ion is not an elemental metal.

4. The method according to claim 1, wherein the second metal ion is chromium (II).

5. The method according to claim 1, wherein the homogeneous first salt solution and the homogenous second salt solution are printed via a printing method selected from the group consisting of inkjet, screen printing, gravure, rotogravure, and flexography.

6. The method according to claim 5, wherein the homogeneous first salt solution and the homogeneous second salt solution are printed by an inkjet printer.

7. The method according to claim 6, wherein:
the homogeneous first salt solution contains copper (II) as the first metal ion; and
the second salt solution contains chromium (II) as the second metal ion.

8. The method according to claim 5, wherein the two homogenous salt solutions are printed in a manner such that one salt solution fully overlaps the other solution.

9. The method according to claim 5, wherein the two homogeneous salt solutions are printed in a manner such that the two salt solutions only partially overlap.

10. The method according to claim 5, wherein the two homogeneous salt solutions are printed via a two-pass process, whereby the inkjet printer prints one homogeneous salt solution during the first pass over the substrate, and then prints the other homogeneous salt solution during a subsequent second pass over the substrate.

11. The method according to claim 5, wherein the two homogeneous salt solutions are printed during a single pass of the inkjet printer over the substrate.

12. A method of printing resonant antennae in chipless RFID applications, comprising the method of claim 1.

13. The method according to claim 1, wherein the second metal ion is lead (II).

14. The method according to claim 1, wherein the second ionic metal species in the homogeneous second salt solution is provided in the form of a metal salt selected from the group consisting of metal sulfates, metal halides, metal acetates, metal oxides, metal carbonates, metal hydroxides, metal oxalates, metal pyrazolyl borates, metal azides, metal fluoroborates, metal carboxylates, metal halogencarboxylates, metal hydroxycarboxylates, metal aminocarboxylates, metal aromatics, which may optionally be nitro and/or fluoro substituted aromatic carboxylates, metal beta diketonates, and metal sulfonates.

15. The method of claim 1, wherein at least one of the first solvent and the second solvent has a melting point of at least 30° C. and less than or equal to 100° C.

16. A method of printing a conductive metal wire on a substrate, comprising:
depositing a first ionic metal solution comprising a first solvent and an oxidizing first metal ion directly onto a substrate, the first metal ion selected from the group consisting of copper, aluminum, magnesium, manganese, zinc, chromium, lead, cadmium, cobalt, nickel, gold, silver, platinum, tin, iron, and mixtures thereof; and depositing a second ionic metal solution comprising a second solvent and a reducing second metal ion directly onto the substrate, the second metal ion selected from the group consisting of iron (II), lead (II), chromium (II), mercury (II), platinum (IV), palladium (IV), nickel (III), and cobalt (III), the second ionic metal solution configured to reduce the first ionic metal solution; and forming a metal wire on the substrate by the galvanic reaction on the substrate of the deposited first and second ionic solutions to precipitate a reduced solid metal form of the first metal ion on the substrate, the solid metal form comprising metal nanoparticles having a size of about 5 nm to about 7 nm, wherein at least one of the first and second ionic solutions are deposited on the substrate in a flowable form using a heated printer head, wherein additional energy is not required to anneal the metal nanoparticles together and create the conductive metal wire, and wherein the reducing second metal ion has a lower reduction potential than the oxidizing first metal ion.

17. The method of printing a conductive metal wire on a substrate of claim 16, wherein
a width of the metal wire is controlled by an overlap amount of the deposited first and second ionic solutions.

18. The method of printing a conductive metal wire on a substrate of claim 16, wherein the first and second solvent mix upon deposition on the substrate and react under a galvanic reaction to precipitate the reduced first metal ion nanoparticle.

19. The method of printing a conductive metal wire on a substrate of claim 18, further comprising:
evaporating the first and second solvents from the substrate to deposit the metal wire comprising the reduced first metal ion nanoparticle.

20. The method of printing a conductive metal wire on a substrate of claim 16, wherein the conductive metal wire has a thickness of about 0.01 μm to about 5 μm and a print resistance of about 10 Ohms/square to about 10,000 Ohms/square.

* * * * *